United States Patent
Cheng et al.

(10) Patent No.: US 10,541,271 B2
(45) Date of Patent: Jan. 21, 2020

(54) SUPERLATTICE-LIKE SWITCHING DEVICES

(71) Applicant: MACRONIX INTERNATIONAL CO., LTD., Hsinchu (TW)

(72) Inventors: Huai-Yu Cheng, White Plains, NY (US); Hsiang-Lan Lung, Ardsley, NY (US); I-Ting Kuo, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/787,274

(22) Filed: Oct. 18, 2017

(65) Prior Publication Data
US 2019/0115393 A1    Apr. 18, 2019

(51) Int. Cl.
*H01L 27/24*    (2006.01)
*H01L 45/00*    (2006.01)

(52) U.S. Cl.
CPC .......... *H01L 27/2427* (2013.01); *H01L 45/04* (2013.01); *H01L 45/1233* (2013.01); *H01L 45/141* (2013.01); *H01L 45/143* (2013.01); *H01L 45/148* (2013.01); *H01L 45/06* (2013.01); *H01L 45/144* (2013.01); *H01L 45/1625* (2013.01)

(58) Field of Classification Search
CPC ..... H01L 45/06–065; H01L 45/12–149; H01L 45/1233; H01L 45/148; H01L 45/1273–144; H01L 27/24–249; H01L 27/2427; G11C 11/5678; G11C 13/0002; G11C 13/0004; G11C 13/0007; G11C 2213/31
See application file for complete search history.

(56) References Cited

U.S. PATENT DOCUMENTS

| | | |
|---|---|---|
| 5,177,567 A | 1/1993 | Klersy et al. |
| 6,579,760 B1 | 6/2003 | Lung |
| 6,800,504 B2 | 10/2004 | Li et al. |
| 6,967,344 B2 | 11/2005 | Ovshinsky et al. |
| 6,995,390 B2 | 2/2006 | Tsukui |
| 7,483,293 B2 | 1/2009 | Pinnow et al. |
| 7,688,619 B2 | 3/2010 | Lung et al. |
| 7,902,538 B2 | 3/2011 | Lung |
| 7,903,457 B2 | 3/2011 | Lung |
| 7,929,340 B2 | 4/2011 | Lung et al. |
| 8,178,387 B2 | 5/2012 | Cheng et al. |
| 8,315,088 B2 | 11/2012 | Lung |
| 8,324,605 B2 | 12/2012 | Lung et al. |

(Continued)

FOREIGN PATENT DOCUMENTS

CN    1568494 A    1/2005

OTHER PUBLICATIONS

Ohyanagi et al., "Special Electrical Characteristics of Superlattice Phase Change Memory," ECS, Oct. 31, 2013.
(Continued)

*Primary Examiner* — Tucker J Wright
(74) *Attorney, Agent, or Firm* — Haynes Beffel & Wolfeld LLP

(57) ABSTRACT

A voltage sensitive switching device is described having a superlattice-like cell structure comprising layers of ovonic materials, such as chalcogenide alloys. Memory cells can include the switching device, such as can be utilized in a cross-point memory.

16 Claims, 7 Drawing Sheets

(56) References Cited

U.S. PATENT DOCUMENTS

| | | | |
|---|---|---|---|
| 8,363,463 B2 | 1/2013 | Shih et al. | |
| 8,426,242 B2 | 4/2013 | Cheng et al. | |
| 8,467,236 B2 | 6/2013 | Campbell | |
| 8,772,747 B2 | 7/2014 | Cheng et al. | |
| 8,916,414 B2 | 12/2014 | Cheng et al. | |
| 8,932,901 B2 | 1/2015 | Cheng | |
| 8,946,666 B2 | 2/2015 | Cheng et al. | |
| 9,177,640 B2 | 11/2015 | Shintani et al. | |
| 9,214,229 B2 | 12/2015 | Cheng et al. | |
| 9,336,879 B2 | 5/2016 | Lung et al. | |
| 9,917,252 B2 | 3/2018 | Cheng et al. | |
| 2005/0018098 A1 | 1/2005 | Sugihara et al. | |
| 2011/0049456 A1 | 3/2011 | Lung et al. | |
| 2012/0025164 A1* | 2/2012 | Deweerd | G11C 13/0004 257/5 |
| 2013/0270505 A1 | 10/2013 | Dahmani | |
| 2014/0376307 A1* | 12/2014 | Shintani | G11C 13/0004 365/163 |
| 2016/0276022 A1 | 9/2016 | Redaelli | |
| 2017/0250222 A1 | 8/2017 | Wu et al. | |
| 2017/0263863 A1 | 9/2017 | Lung et al. | |
| 2017/0271581 A1 | 9/2017 | Seong et al. | |
| 2018/0040669 A1* | 2/2018 | Wu | H01L 23/528 |

OTHER PUBLICATIONS

Ovshinsky, "New Transformative Possibilities for Ovonic Devices," E*PCOS2010, European Symposium on Phase Change and Ovonic Science, Milan, Italy Sep. 6-7, 2010, 9 pages.

Schuller, Ivan K., Stevens, Rick, Pino, Robinson, and Pechan, Michael. Neuromorphic Computing—From Materials Research to Systems Architecture Roundtable. "Report of a Roundtable Convened to Consider Neuromorphic Computing Basic Research Needs," Oct. 29-30, 2015, 40 pages.

Shanks, "Ovonic threshold switching characteristics," Journal of Non-Crystalline Solids, vol. 2, Jan. 1970, pp. 504-514.

Shin et al., "The effect of doping Sb on the electronic structure and the device characteristics of Ovonic Threshold Switches based on Ge—Se," Scientific Reports, Nov. 18, 2014, 5 pages.

Simpson et al., "Interfacial phase-change memory," Nature Nanotechnology, vol. 6, Jul. 3, 2011, 502-505.

U.S. Appl. No. 15/587,085, entitled "Dielectric Doped, Sb-Rich GST Phase Change Memory," filed May 4, 2017, 35 pages.

* cited by examiner

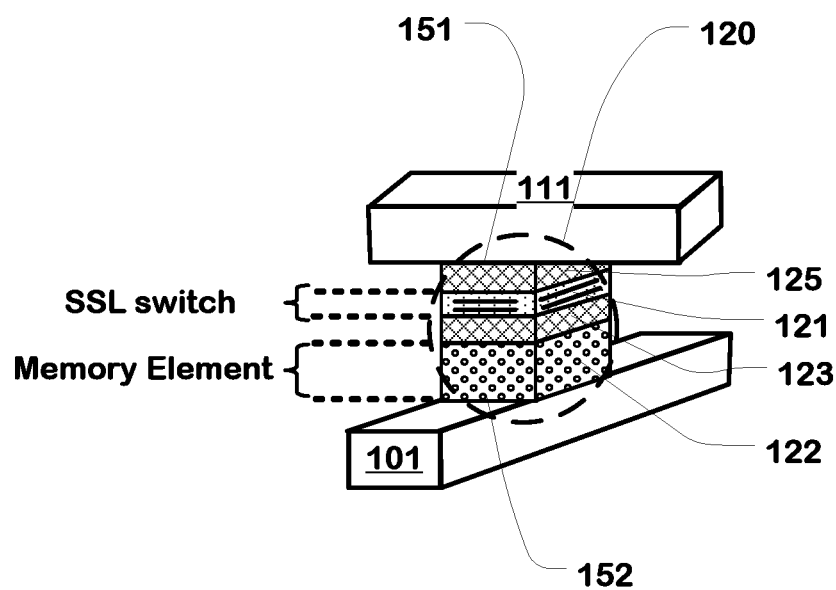
FIG. 3
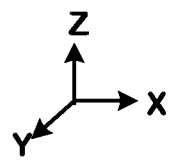

SUPERLATTICE-LIKE SWITCHING DEVICES

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND

Field

The present invention relates to switching devices utilized in integrated circuits, including integrated circuit memory devices.

Description of Related Art

There are many applications for switching devices, such as transistors and diodes, in integrated circuits. One type of switching device is known as the ovonic threshold switch, based on ovonic materials, characterized by a large drop in resistance at a switching threshold voltage, and recovery of a high resistance, blocking state when the voltage falls below a holding threshold.

Switching devices have been used, for example, in various programmable resistance memory devices comprising high density arrays of cells organized in a cross-point architecture, such as described in U.S. Pat. No. 6,579,760, entitled SELF-ALIGNED, PROGRAMMABLE PHASE CHANGE MEMORY, issued 17 Jun. 2003, by Lung. Some cross-point architectures utilize memory cells that include a phase change memory element in series with an ovonic threshold switch, for example. Other architectures are utilized, including a variety of 2-dimensional and 3-dimensional array structures, which can also utilize switching devices to control access to memory elements in the array. In cross-point arrays, and other high density arrays, access to any small subset of the array for accurate reading or low-power writing requires a strong nonlinearity in the I-V characteristics of the switch in the memory cells, so that the currents passing through the selected devices greatly exceed the residual leakage through the nonselected devices. This nonlinearity can either be included explicitly, by adding a discrete access device at each cross-point, or implicitly with an NVM device which also exhibits a highly nonlinear I-V characteristic.

Also, ovonic threshold switches have been proposed for a variety of other uses, including so called neuromorphic computing. See, Ovshinsky, "New Transformative Possibilities for Ovonic Devices," E*PCOS2010, European Symposium on Phase Change and Ovonic Science, Milan, Italy Sep. 6-7, 2010, 9 pages.

One important characteristic of switching devices, particularly in integrated circuits having very large numbers of them, is leakage current. The leakage current is the amount of current flow in a switching device in a sub-threshold state. Also, switching devices should have fast switching speeds, and high endurance.

It is desirable to provide a switching device with low leakage current, fast switching speeds and high endurance.

SUMMARY

A voltage sensitive switching device is described having a superlattice-like cell structure comprising layers of ovonic materials, such as chalcogenide alloys. Memory cells including the switching device are described, such as can be utilized in a cross-point memory. Also the switching device can be utilized in a variety of other kinds of devices.

A switching device described herein comprises a first electrode; a second electrode; and a stack of layers of ovonic materials between the first and second electrodes, the layers in the stack contacting adjacent layers in the stack, and adjacent layers in the stack having different compositions. In an embodiment described herein, the stack of layers includes periodic sets of layers. The sets of layers may have two members each, making a pair of layers. In sets having two members each, the layers in each pair are two different chalcogenide alloys. Also, in illustrated embodiments, different layers in the set can include different alloys containing Se. Also, in illustrated embodiments, different layers in the set can include different alloys containing Se and As.

A memory device is described that includes memory cells, including phase change memory cells, having switching devices as described herein.

Other aspects and advantages of the present invention can be seen on review of the drawings, the detailed description and the claims, which follow.

BRIEF DESCRIPTION OF THE DRAWINGS

FIG. 3 illustrates a memory cell including a superlattice-like switching device as described herein.

DETAILED DESCRIPTION

A detailed description of embodiments of the present invention is provided with reference to the FIGS. 1-8.

Figure 1:
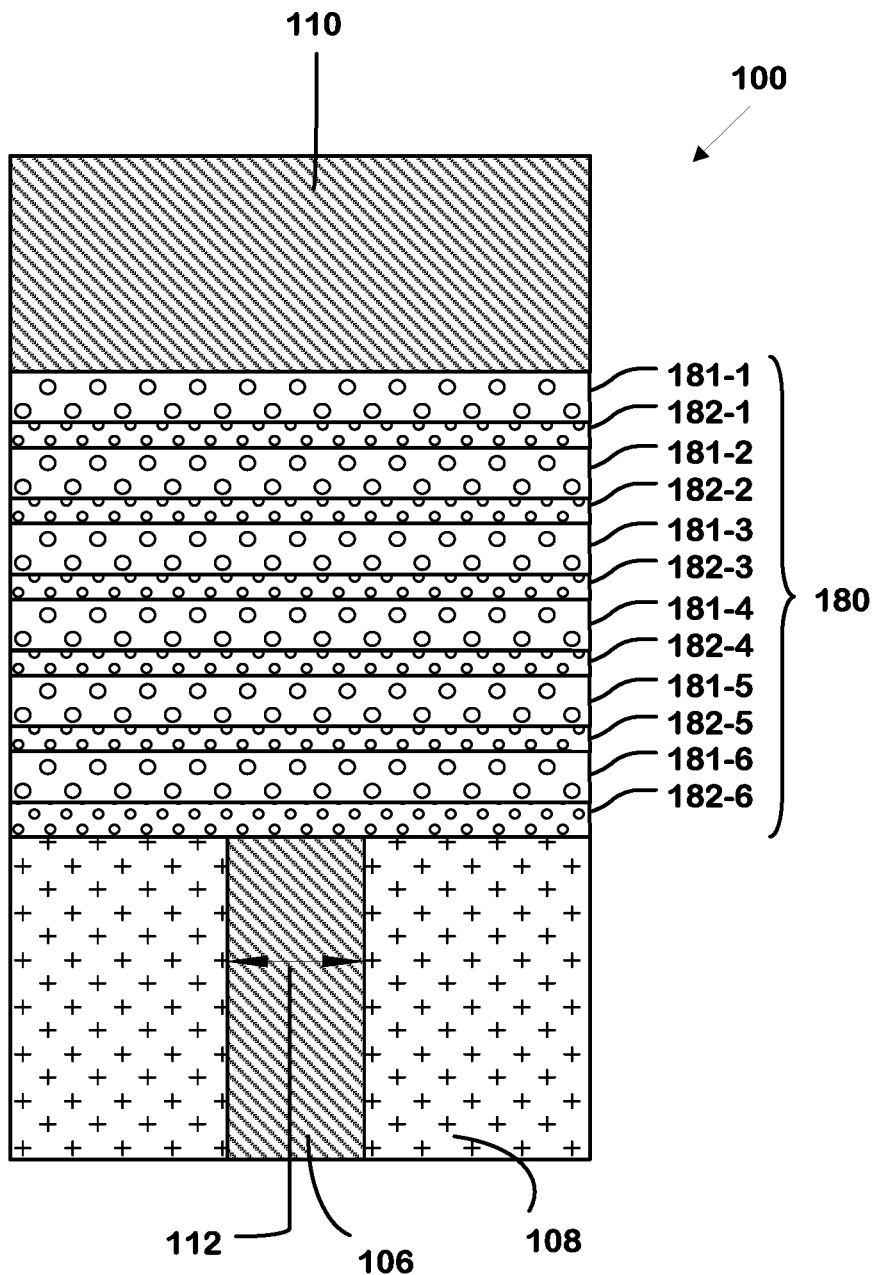
FIG. 1 is a cross-sectional view of a first embodiment of a switching device 100 having alternating layers of two different ovonic materials.

FIG. 1 illustrates a cross-sectional view of a switching device 100 including a superlattice-like structure of periodic stack of layers of ovonic materials where contacting layers in the stack include different materials. For the purposes of this description, the structure is referred to as superlattice-like, rather than more simply as a superlattice, because some or all of the layers in the periodic stack of layers of materials can be amorphous rather than crystalline.

The switching device 100 comprises a stack 180 of alternating layers of different chalcogenide alloys in this example. The stack comprises layers 181-1, 181-2, 181-3, 181-4, 181-5, 181-6 of a first chalcogenide alloy containing Se and As, TeAsGeSeSiS for example, and layers 182-1, 182-2, 182-3, 182-4, 182-5, 182-6 of a second chalcogenide alloy containing Se and As, $As_2Se_3$ for example. The layers

181-1, 181-2, 181-3, 181-4, 181-5, 181-6 contact adjacent layers 182-1, 182-2, 182-3, 182-4, 182-5, 182-6 in a superlattice-like structure. The thickness of the alternating layers in the stack can be in a range from 1 nm to 5 nm. The layers 181-1, 181-2, 181-3, 181-4, 181-5, 181-6 of TeAsGeSeSiS are 4 nm thick, and the layers 182-1, 182-2, 182-3, 182-4, 182-5, 182-6 of $As_2Se_3$ are 1 nm thick in this example.

Thus, the structure shown in FIG. 1 includes repeating sets of layers, where each set has two members. In alternative structures, the repeating sets have more than two members, at least one layer in each set being different ovonic material than at least one other layer in the set.

In embodiments described herein, the layers 181-1, 181-2, 181-3, 181-4, 181-5, 181-6 are thicker than the layers 182-1, 182-2, 182-3, 182-4, 182-5, 182-6. In some embodiments, the layers 181-1, 181-2, 181-3, 181-4, 181-5, 181-6 are at least twice as thick as the layers 182-1, 182-2, 182-3, 182-4, 182-5, 182-6, and the layers 182-1, 182-2, 182-3, 182-4, 182-5, 182-6 are less than 2 nm thick.

Embodiments of the switching device have pairs of layers in which the chalcogenide alloys in both layers of the pair contain selenium Se. Embodiments of the switching device have pairs of layers in which the chalcogenide alloys are different, and in which in both layers of the pair contain selenium Se and arsenic As.

In the embodiment shown in FIG. 1, the stack 180 includes six pairs of layers of alternating first and second layers of different chalcogenide alloys. In embodiments, the total thickness of the stack 180 can range from 4 nm to 60 nm. The switching threshold and leakage current can be tuned by adjusting the number of pairs of layers, and by adjusting the thickness of the individual layers. Switching devices having between two and six pairs of layers are expected to have beneficial characteristics for various applications of the switching device.

The first chalcogenide alloy for the layers 181-1, 181-2, 181-3, 181-4, 181-5 can comprise compositions of elements including for example a selected one of AsSe, AsTe, TeAsGeSi, TeAsGeSiN, TeAsGeSiSe, TeAsGeSiSeS, TeAsGeSiSeP, GeSe, GeAsSe, and AsGeSiSe.

The second chalcogenide alloy for the layers 182-1, 182-2, 182-3, 182-4, 182-5 is different from the first chalcogenide alloy, and can comprise compositions of elements including for example selected different one of AsSe, AsTe, TeAsGeSi, TeAsGeSiN, TeAsGeSiSe, TeAsGeSiSeS, TeAsGeSiSeP, GeSe, GeAsSe, and AsGeSiSe.

In some embodiments, different pairs of layers in the stack 180 may have different pairs of chalcogenide alloys, such that the stack may include more than two chalcogenide alloys.

The switching device 100 includes a first electrode 106 extending through a dielectric layer 108 to contact a bottom surface of the bottom layer 182-6 of the stack 180. A second electrode 110 is formed contacting a top layer 181-1 of the stack 180.

Biasing circuitry (not shown) can apply a voltage across the first and second electrodes 106, 110. If the voltage is higher than a switch threshold, then the resistance of the stack drops, turning on the switch. If the voltage is below the switch threshold, the resistance of the stack remains high, so that the switch is off. When the switch is on, if the voltage drops so that the current falls below a holding current, then the stack recovers the high resistance state.

The first and second electrodes 106 and 110 may comprise, for example, TiN or TaN. Alternatively, the first and second electrodes 106 and 110 may be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof. The dielectric layer 108 may comprise silicon nitride, silicon oxynitride, silicon oxide and any other suitable dielectric material.

The switching device shown in FIG. 1 has a first electrode 106 with a relatively narrow width 112 (which in some embodiments is a diameter). The narrow width 112 of the first electrode 106 results in an area of contact between the first electrode 106 and the stack 180 that is less than the area of contact between the stack 180 and the second electrode 110. Thus, current is concentrated in the portion of the stack 180 adjacent the first electrode 106, resulting in an active region being in contact with or near the first electrode 106.

Figure 2:
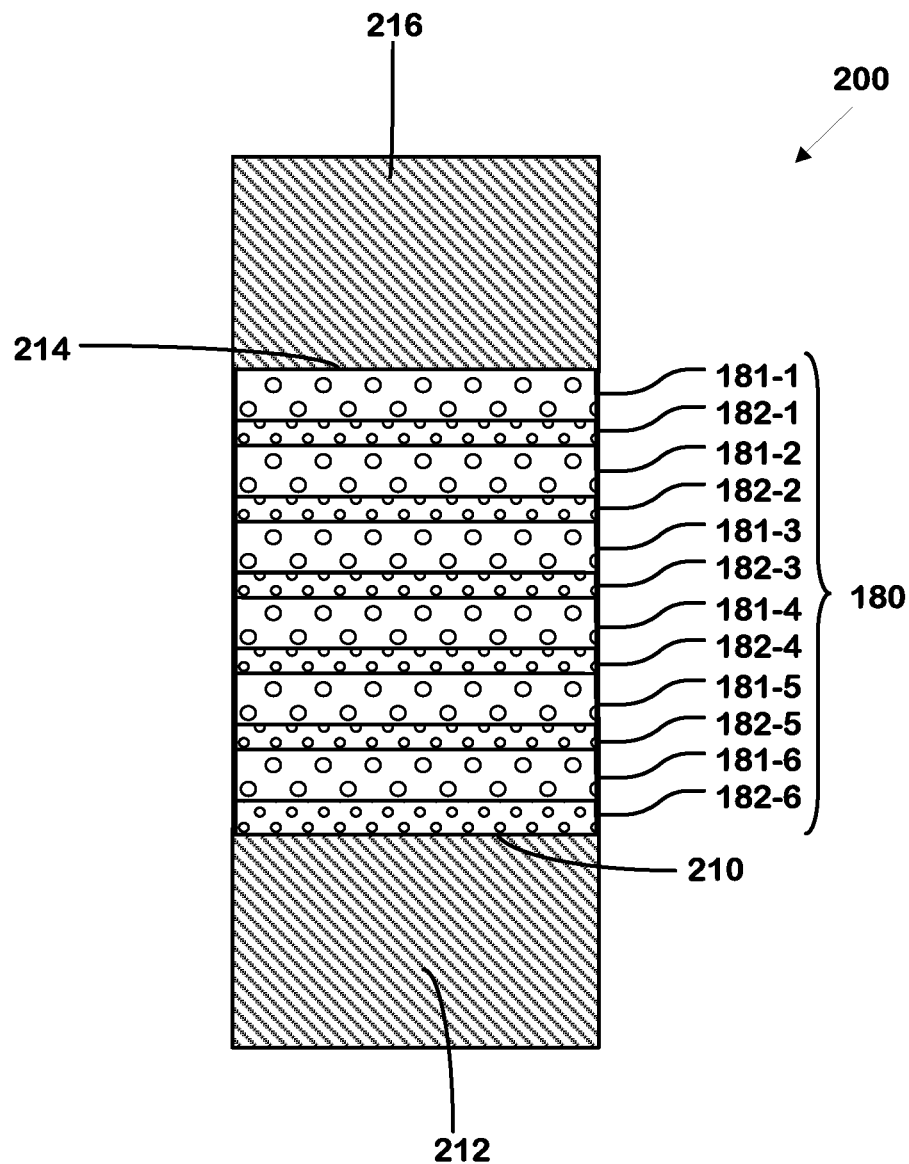
FIG. 2 is a cross-sectional view of a second embodiment of a switching device 100 having alternating layers of two different ovonic materials.

FIG. 2 illustrates a cross-sectional view of a pillar-type switching device 200. Switching device 200 includes a stack 180 described with reference to FIG. 1. The stack 180 is in a pillar shape and contacts first and second electrodes 212 and 216 at bottom and top surfaces 210 and 214, respectively. The stack 180 has a width substantially the same as that of the first and second electrodes 212 and 216 to define a multi-layer or superlattice-like pillar surrounded by dielectric (not shown). As used herein, the term "substantially" is intended to accommodate manufacturing tolerances.

FIG. 3 illustrates an example memory cell 120. Memory cell 120 is in contact with the first access line (bit line) 111, and in contact with the second access line (word line) 101. Memory cell 120 includes a switching device 121 proximal to the first access line 111 at surface 151, and a memory element 122 proximal to the second access line 101 at surface 152. A first barrier layer 123 is disposed between the switching device 121 and the memory element 122. A second barrier layer 125, acting as a switch electrode, is disposed in this example between the switching device 121 and the surface 151 of the first access line 111. The switching device 121, for example, can be a two-terminal, superlattice-like switch (SSL-switch) as described above. The thickness of the SSL switch is preferably less than 60 nm.

The first barrier layer 123 can provide adhesion and diffusion barrier functions between the switching device 121 and the memory element 122. The first barrier layer 123 may have a layer of conductive material with a thickness of about 5 to about 50 nm, preferably about 20 nm. Example materials for the first barrier layer 123 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, first barrier layer 123 can comprise doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON).

The second barrier layer 125 can provide adhesion and diffusion barrier functions between the switching device 121 and the first access line 111, and act as an electrode on the switching device 121. The second barrier layer 125 can have the same material as the first barrier layer 123, such as TiN, and act as an electrode on the switching device 121. In some embodiments, the second barrier layer 125 can have a different material than the first barrier layer 123. In some embodiments, the second barrier layer 125 can be eliminated such that the switching device 121 is in contact with the first access line 111 which acts as an electrode on the switching device 121.

The memory element 122 can comprise a layer of programmable resistance material. In one example, the memory element 122 comprises a phase change memory material. In some embodiments, other programmable resistance memory elements can be implemented, such as metal-oxide resistive memories, magnetic resistive memories and conducting-bridge resistive memories.

A phase change memory material can be, for example, a layer of chalcogenide having a thickness of about 10 nm to about 50 nm, preferably about 30 nm. Chalcogenides utilized as phase change memory elements are capable of being switched between a relatively low resistance state, amorphous phase, and a relatively high resistance state, crystalline phase, by application of energy such as heat or electrical current. In some embodiments, multilevel cells having multiple resistance states can be used.

Embodiments of materials for the memory element 122 can include chalcogenide-based materials and other materials. A chalcogenide-based material suitable for use as a memory element can contain one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example dielectric doped $Ge_2Sb_2Te_5$, $GeSb_2Te_4$ and $GeSb_4Te_7$. In some embodiments, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials that may be useful are disclosed in Ovshinsky, U.S. Pat. No. 5,687,112 at columns 11-13, which examples are incorporated by reference.

The memory element 122 can comprise a layer of chalcogenide alloy with additives to modify conductivity, transition temperature, melting temperature, and other properties. Representative additives can include nitrogen (N), silicon (Si), oxygen (O), silicon dioxide (SiOx), silicon nitride (SiN), copper (Cu), silver (Ag), gold (Au), aluminum (Al), aluminum oxide ($Al_2O_3$), tantalum (Ta), tantalum oxide (TaOx), tantalum nitride (TaN), titanium (Ti), and titanium oxide (TiOx).

The first access lines (bit lines) and the second access lines (word lines) can comprise a variety of metals, metal-like materials and doped semiconductors, or combinations thereof. Embodiments of the first and second access lines can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials. For example, the thicknesses of the first access lines and the second access lines can range from 10 to 100 nm. In other embodiments, the first access lines and the second access lines can be very thin, or much thicker. The material selected for the second access lines is preferably selected for compatibility with the memory element 122. Likewise, the material selected for the first access lines is preferably selected for compatibility with the second barrier layer 125.

In another embodiment, a bottom electrode (not shown) having a smaller contact surface than the surface of the memory element is interposed between the memory element 122 and the switching device 121 or between the memory element 122 and the second access line 101. As such, an increased current density at the contact in the memory element can be achieved. Such bottom electrode may comprise titanium nitride (TiN), tantalum nitride (TaN), titanium silicon nitride (TiSiN), titanium aluminum nitride (TiAlN), tantalum aluminum nitride (TaAlN), and tungsten nitride (WN). The bottom electrode in contact with the active region of the chalcogenide alloy is sometimes referred to as a "heater," reflecting embodiments in which the electrode can have relatively high resistance, and contributes to the Joule heating in the active region of the chalcogenide alloy.

Figure 4:
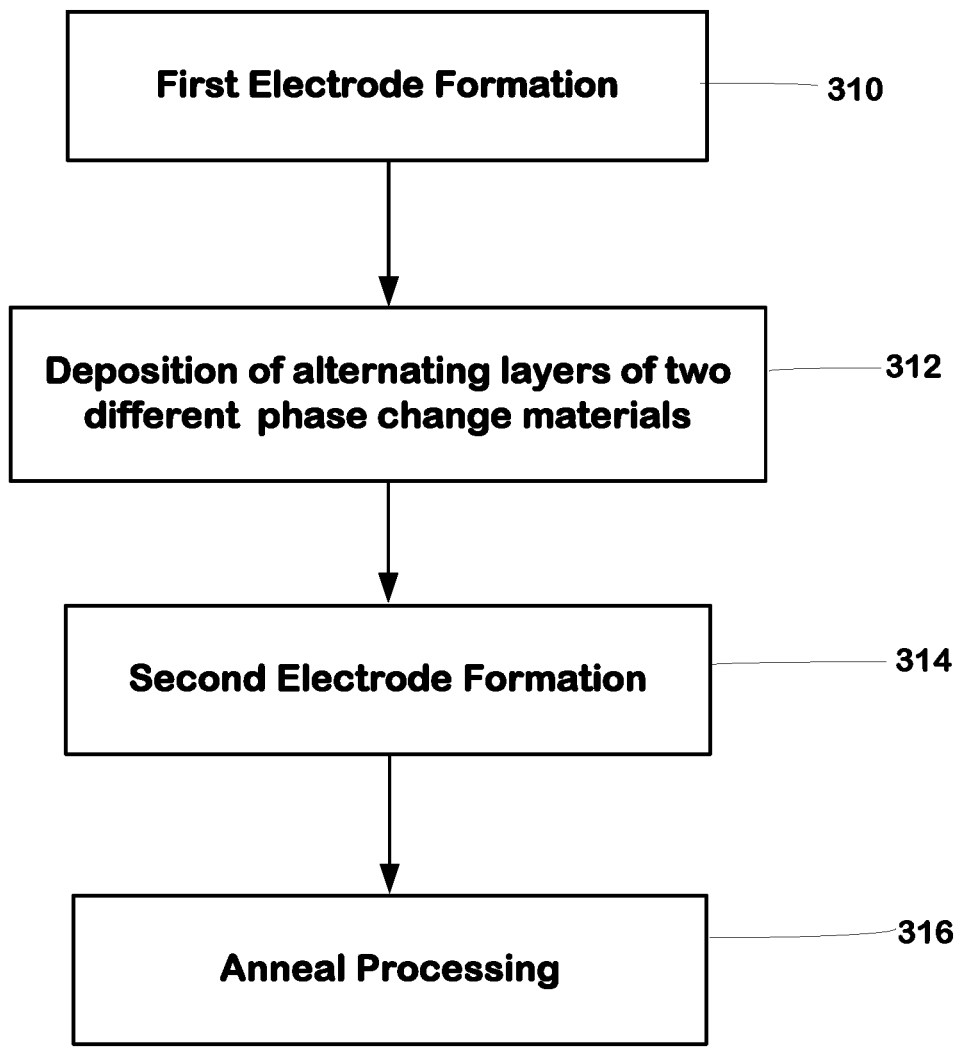
FIG. 4 illustrates a manufacturing process flow for manufacturing a switching device having a switching device described herein.

FIG. 4 is a simplified flow chart of a manufacturing process for manufacturing a switching device like that shown in FIG. 1. Reference numerals used in the following description of the process of FIG. 4 are taken from FIG. 1. At step 310, the first electrode 106 having a width 112 (or diameter) is formed extending through dielectric layer 108. The first electrode 106 comprises TiN and the dielectric layer 108 comprises SiN. Alternatively, the materials for the first electrode 106 and the dielectric layer 108 can be chosen from the materials described with reference to FIG. 1.

The first electrode 106 is extends through dielectric layer 108 to underlying circuitry (not shown). The underlying circuitry can be formed by standard processes as known in the art, and the configuration of elements of the circuitry depends upon the configuration in which the switching devices described herein are implemented. Generally, the circuitry may include access devices such as transistors, diodes, ovonic threshold switches, bit lines, word lines and source lines, conductive plugs, and doped regions within a semiconductor substrate.

The first electrode 106 and the dielectric layer 108 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Pat. No. 8,138,028), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 106. Next, the mask of photoresist is trimmed, using for example oxygen plasma, to form a mask structure having sublithographic dimensions overlying the location of the first electrode 106. Then the layer of electrode material is etched using the trimmed mask of photoresist, thereby forming the first electrode 106 having a narrow (sublithographic) width 112. Next, dielectric material is formed and planarized to form dielectric layer 108.

Alternatively, the switching devices can be organized in a cross-point architecture, such as described in U.S. Pat. No. 6,579,760, entitled SELF-ALIGNED, PROGRAMMABLE PHASE CHANGE MEMORY, issued 17 Jun. 2003, which is incorporated by reference herein. The first electrode can be the access lines, such as word lines and/or bit lines. In such architecture, the access devices are arranged between the switching devices and the access lines.

At step 312, the stack 180, including the stack of alternating layers, is formed in a sputtering system. The stack consists of alternating 1 nm As2Se3 or other combination of AsSe (layers 182-1, 182-2, 182-3, 182-4, 182-5) and 4 nm TeAsGeSeSiS (layers 181-1, 181-2, 181-3, 181-4, 181-5) in this example. During the formation of the alternating layers, the substrate may not moved in and out of the sputtering system. Then, a capping layer, for example 10 nm of TiN (not shown), is formed over the stack to prevent oxidation of the chalcogenide alloy.

At step 314, a second electrode 110 is formed. The second electrode 110 can be formed by deposition and patterned etch, for example, of a conductive material.

Figure 8:
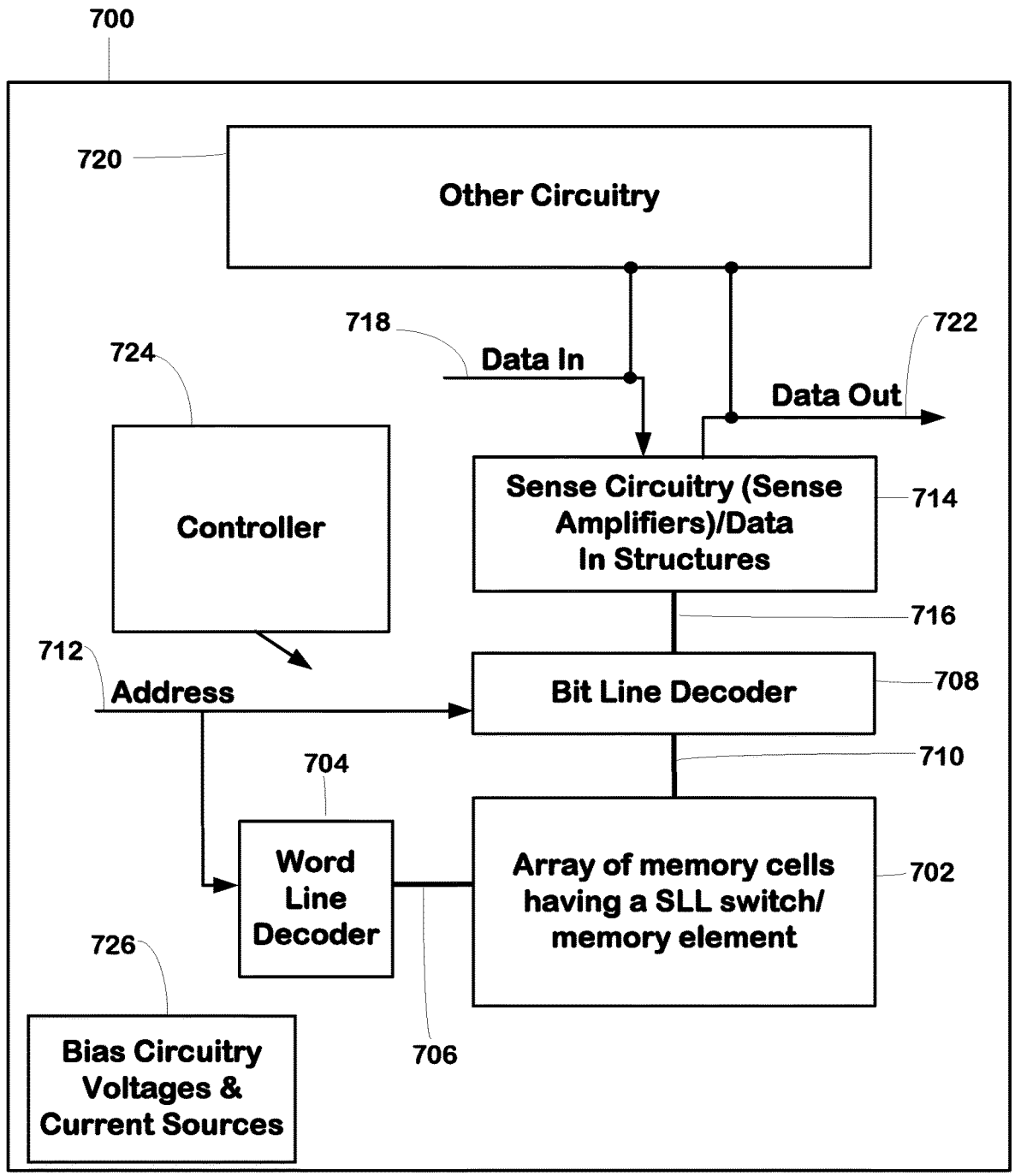
FIG. 8 is a simplified block diagram of an integrated circuit 700 including an array 702 of memory cells having switching devices as described herein.

At step 316, anneal processing is performed to stabilize the characteristics of the switching devices formed. The resulting structure is annealed at 200° C. or more in a forming operation to stabilize the characteristics of the cell. In this example, the anneal is performed at about 300° C. for 30 minutes. This annealing process can be combined with back-end-of-line (BEOL) processing. The BEOL process is to complete the semiconductor process steps of the chip, resulting in the structure illustrated in FIG. 8. The BEOL processes can be standard processes as known in the art, and the processes performed depend upon the configuration of the chip in which the switching device is implemented. Generally, the structures formed by BEOL processes may include contacts, inter-layer dielectrics and various metal layers for interconnections on the chip including circuitry to couple the switching device to periphery circuitry As a result of these processes, control circuits and biasing circuits as shown in FIG. 8 are formed on the device.

Figure 5:
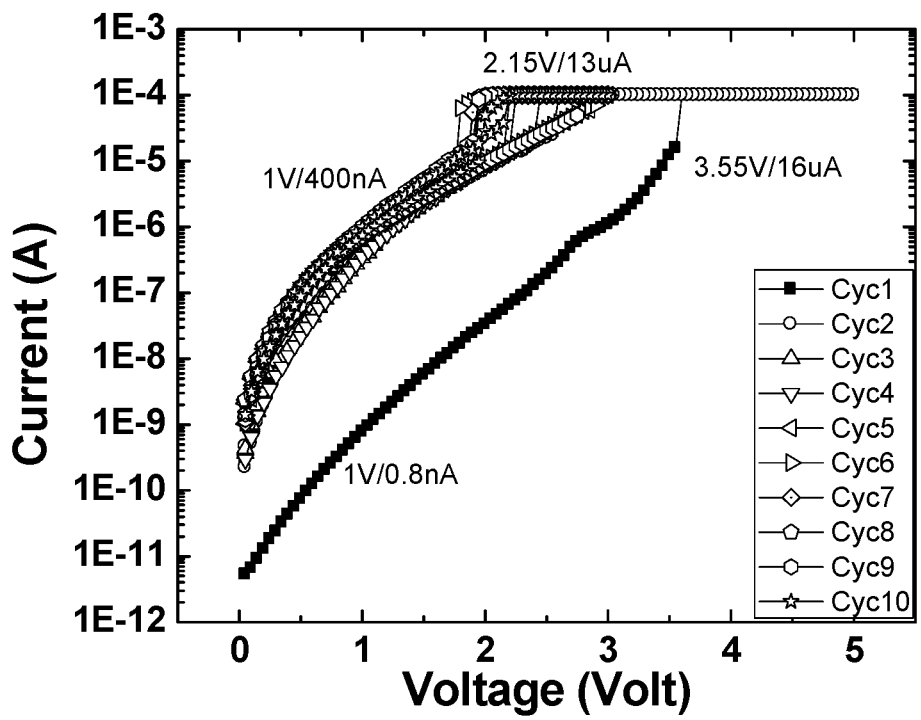
FIG. 5 is a graph of I-V characteristics of the superlattice-like structure without annealing.

FIG. 5 illustrates I-V characteristics of the switching device as deposited (without annealing). In a first cycle (Cyc 1), the I-V line is straight with the current level on the log scale until a threshold at about 3.55 V, where the resistance drops to the on-state resistance, and the current amplitude jumps. As the voltage is reduced to about 2.15 V with a current magnitude of about 13 µA, the holding level is reached and the resistance increases rapidly to the off-state resistance, and the current amplitude drops. After the first cycle, the switching behavior is poor. The leakage current at 1 V is 400 nA or higher.

Figure 6:
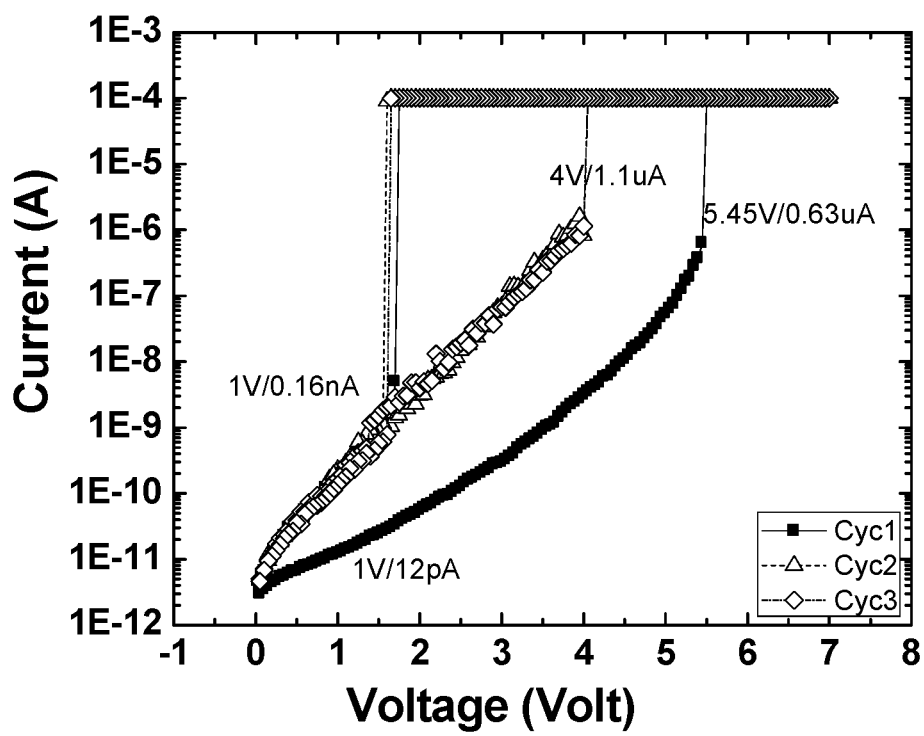
FIG. 6 is a graph of I-V characteristics of the superlattice-like structure after the anneal process.

FIG. 6 illustrates I-V characteristics of the switching device made using the anneal process, in which the cell is heated at about 300° C. for 30 minutes. In the first cycle, the switching threshold is about 5.45 V. In the following cycles, the switching behavior remains good, with a switching threshold at about 4 V. The holding threshold voltage with a current at about 13 µA, is about 1.7 V. When the voltage applied at the cell is 1 V, at the first cycle, the cell exhibits 12 µA leakage current. After the first cycle, the leakage current remains very low at about 0.16 nA at 1 V applied voltage.

Figure 7:
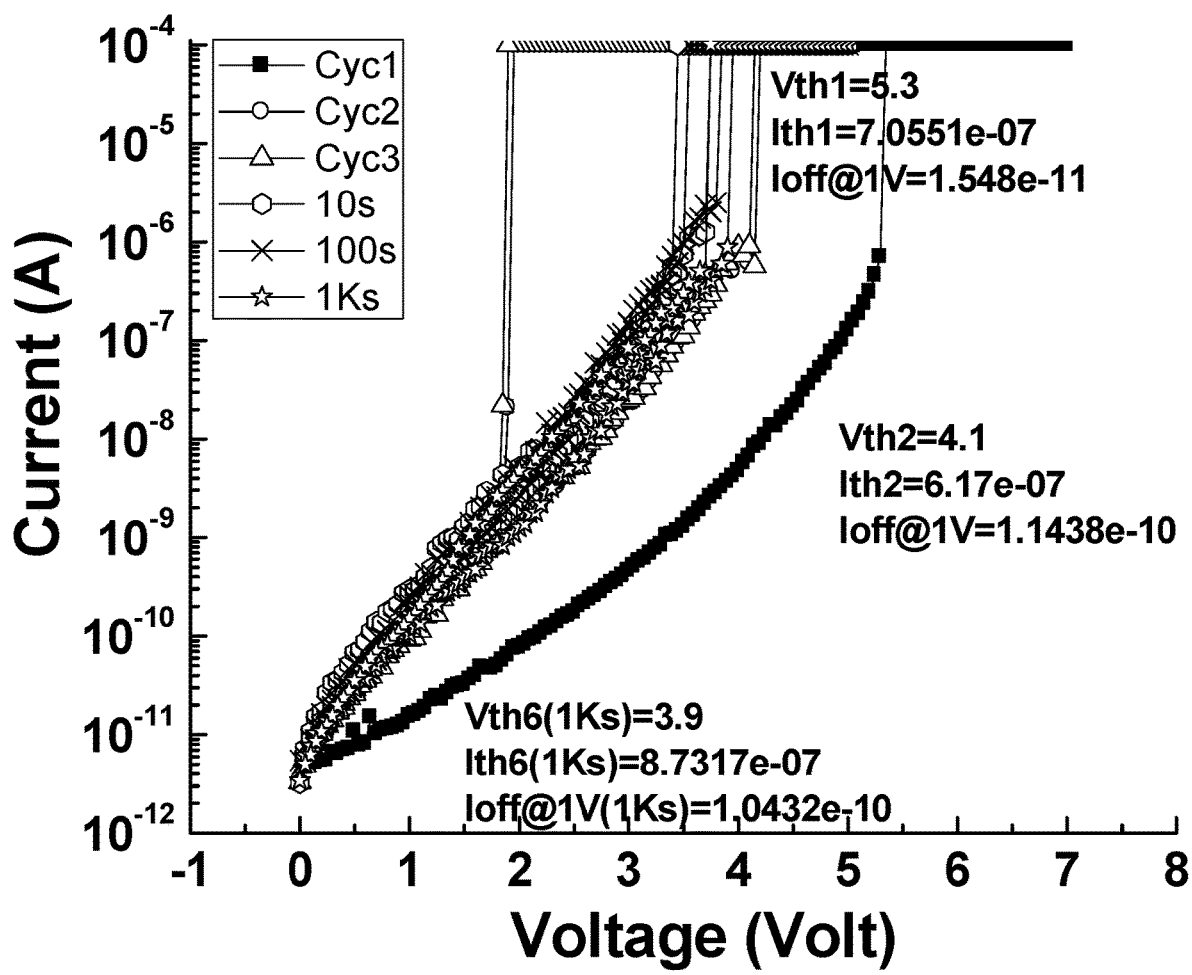
FIG. 7 is a graph of I-V characteristics during testing of endurance of the switching device based on a superlattice-like structure as described herein.

FIG. 7 illustrates I-V characteristics of the switching device made using the anneal process in several stages of a constant current endurance test. After the first DC cycle in the test, the threshold Vth1 is about 5.3 V, the current Ith1 at the switching threshold is about 0.7 µA, and the leakage current (Ioff@1V) is around 15 pA at 1 V. After the second DC cycle, the threshold Vth2 is about 4.1 V, the current Ith2 at the switching threshold is about 0.6 µA, and the leakage current (Ioff@1V) is around 0.1 nA at 1 V. In this experiment, after 3 cycles (Cyc 3), the cell is stressed with 300 µA for 10 seconds (10 s). After one more cycles, the cell is stressed with 300 µA for 100 seconds (100 s). After another one more cycle, the cell is stressed with 300 µA for 1000 seconds (1 Ks). A further DC cycle is then applied and plotted. After the 1 Ks stress, the threshold Vth6 is about 3.9 V, the current Ith6 at the switching threshold is about 0.9 µA, and the leakage current (Ioff@1V) remains around 0.1 nA at 1 V. These tests demonstrate suitable endurance for the switching device for many applications. For example, the DC stress for an interval of 1000 seconds can correspond with the stress encountered in an environment where the switching device is operated with 50 nanosecond operating times for 1000 seconds divided by 50 nanoseconds, or 2E10 cycles, suggesting the switching device could have an endurance of 2E10 cycles.

FIG. 8 is a simplified block diagram of an integrated circuit 700 including an array 702 of memory cells having switching devices (SSL switch) as described herein. A word line decoder 704 having read, set and reset modes is coupled to, and in electrical communication with, a plurality of word lines 706 arranged along rows in the array 702. A bit line decoder 708 is in electrical communication with a plurality of bit lines 710 arranged along columns in the array 702 for reading, setting, and resetting the memory cells in the array 702. Addresses are supplied on bus 712 to word line decoder 704 and bit line decoder 708. Sense circuitry (Sense amplifiers) and data-in structures in block 714, including voltage and/or current sources for the read, set, and reset modes are coupled to bit line decoder 708 via data bus 716. Data is supplied via a data-in line 718 from input/output ports on integrated circuit 700, or from other data sources internal or external to integrated circuit 700, to data-in structures in block 714. Other circuitry 720 may be included on integrated circuit 700, such as a general purpose processor or special purpose application circuitry, or a combination of modules providing system-on-a-chip functionality supported by array 702. Data is supplied via a data-out line 722 from the sense amplifiers in block 714 to input/output ports on integrated circuit 700, or to other data destinations internal or external to integrated circuit 700.

A controller 724 implemented in this example, using a bias arrangement state machine, controls the application of bias circuitry voltage and current sources 726 for the application of bias arrangements, including read, set, reset and verify voltages, and/or currents for the word lines and bit lines. Controller 724 may be implemented using special-purpose logic circuitry as known in the art. In alternative embodiments, controller 724 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 724.

A switching device comprising layers of ovonic materials is described. The layers of ovonic materials are disposed in a superlattice-like structure, and can have low leakage and high endurance. In addition, the switching device can be used as an access device in a memory array, for high density architectures including 3D cross-point arrays.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

1. A switching device, comprising:
   a first electrode;

a second electrode; and a superlattice-like stack of layers of ovonic materials between the first and second electrodes, wherein the stack of layers includes a plurality of sets of layers stacked periodically, at least two layers in each set in the plurality of sets being different chalcogenide alloys, in which a first layer in each set has a thickness less than 5 nm, and a second layer in each set has a thickness less than 5 nm, wherein the different chalcogenide alloys are different alloys containing Se.

2. The device of claim 1, wherein the plurality of sets are pairs of layers including the first and second layers.

3. The device of claim 1, wherein the plurality of sets of layers includes a pair of layers, the layers in the pair being two different alloys containing Se.

4. The device of claim 1, wherein the different chalcogenide alloys are different alloys containing Se and As.

5. The device of claim 1, wherein the stack of layers has a total thickness 60 nm or less.

6. The device of claim 1, wherein the different chalcogenide alloys comprise different compositions of elements selected from a group including AsSe, TeAsGeSi, TeAsGeSiSe, TeAsGeSiSeS, TeAsGeSiSeP, GeAsSe, AsGeSiSe.

7. A memory device, comprising:
a first electrode;
a second electrode;
a layer of programmable resistance material in contact with the first electrode;
a stack of layers of ovonic materials in contact with the second electrode, wherein the stack of layers includes a plurality of sets of adjacent layers in the stack including a first layer and a second layer having different compositions, configured like a super-lattice in which the first layer in each set has a thickness less than 5 nm, and a second layer in each set has a thickness less than 5 nm; and
a barrier layer between the layer of programmable resistance material and the stack of layers.

8. The device of claim 7, wherein the different chalcogenide alloys contain Se.

9. The device of claim 7, wherein the different chalcogenide alloys contain Se and As.

10. The device of claim 7, wherein the stack of layers has a total thickness 60 nm or less.

11. The device of claim 7, wherein different chalcogenide alloys are different compositions of elements selected from a group including AsSe, TeAsGeSi, TeAsGeSiSe, TeAsGeSiSeS, TeAsGeSiSeP, GeAsSe, AsGeSiSe.

12. The device of claim 7, wherein the programmable resistance material comprises a phase change memory material.

13. The device of claim 7, wherein the stack of layers includes a pair of layers, a first one of the layers in the pair being a chalcogenide alloy selected from a group including AsSe, TeAsGeSi, TeAsGeSiSe, TeAsGeSiSeS, TeAsGeSiSeP, GeAsSe, AsGeSiSe, and a second one of the layers in the pair being a chalcogenide alloy selected from a group including AsTe, TeAsGeSi, TeAsGeSiN, GeSe.

14. The device of claim 7, wherein the stack of layers includes a pair of layers, a first one of the layers in the pair being a chalcogenide alloy containing As and Se, and a second one of the layers in the pair being a chalcogenide alloy not containing As and Se.

15. The device of claim 7, wherein the stack of layers includes a pair of layers, the layers in the pair being chalcogenide alloys that do not contain As and Se.

16. A switching device, comprising:
a first electrode;
a second electrode; and
a stack of layers of ovonic materials between the first and second electrodes, the stack including a plurality of pairs of layers in which a first layer in each pair has a thickness less than 5 nm, and a second layer in each pair has a thickness less than 5 nm, the thickness of the first layer being at least twice the thickness of the second layer, and in which the ovonic material in the first and second layers in each pair in the plurality of pairs being different ovonic materials comprising Se.

* * * * *